United States Patent
Kim et al.

(10) Patent No.: US 10,692,439 B2
(45) Date of Patent: Jun. 23, 2020

(54) OLED DISPLAY PANEL AND OLED DISPLAY DEVICE

(71) Applicant: LG Display Co., Ltd., Seoul (KR)

(72) Inventors: Kyung-Min Kim, Seoul (KR); In-Hyo Han, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/153,646

(22) Filed: Oct. 5, 2018

(65) Prior Publication Data
US 2019/0130848 A1    May 2, 2019

(30) Foreign Application Priority Data
Oct. 26, 2017    (KR) .................... 10-2017-0140208

(51) Int. Cl.
*G09G 3/32* (2016.01)
*G09G 3/3266* (2016.01)
*H01L 27/32* (2006.01)

(52) U.S. Cl.
CPC ... *G09G 3/3266* (2013.01); *G09G 2300/0408* (2013.01); *G09G 2300/0426* (2013.01);
(Continued)

(58) Field of Classification Search
CPC ......... G09G 3/3266; G09G 2310/0281; G09G 2310/0291; G09G 2310/08;
(Continued)

(56) References Cited
U.S. PATENT DOCUMENTS

2011/0074746 A1* 3/2011 Chang ............... G09G 3/20 345/204
2014/0071107 A1  3/2014 Hong et al.
(Continued)

FOREIGN PATENT DOCUMENTS

EP    2 690 490 A2    1/2014
EP    3 187 928 A1    7/2017
(Continued)

OTHER PUBLICATIONS

Extended European Search Report dated May 9, 2019 for European Patent Application No. 18181141.5.
(Continued)

*Primary Examiner* — Liliana Cerullo
(74) *Attorney, Agent, or Firm* — Polsinelli PC

(57) ABSTRACT

The present disclosure relates to an OLED display panel and an OLED display device in which a GIP driving circuit is arranged in an active area in order to minimize a bezel size and a GIP signal is applied to the GIP driving circuit arranged in the active area using a single-sided COF, and the OLED display panel includes: an active area including data lines, scan lines intersecting the data lines, and sub-pixels arranged at each intersection; stages of a GIP driving circuit distributed and arranged in a plurality of unit pixel regions corresponding to the scan lines in the active area to supply scan pulses to the scan lines; and a non-active area including a pad part, a link part and a LOG part, wherein the pad part includes a gate pad part for supplying various control signals to the stages of the GIP driving circuit, and a data pad part for supplying a data voltage to each data line, and wherein the non-active area includes a plurality of signal lines extended from the gate pad part via the link part to the LOG part in order to supply various control signals to the GIP parts is arranged.

15 Claims, 9 Drawing Sheets

(52) U.S. Cl.
CPC .............. *G09G 2300/0439* (2013.01); *G09G 2310/0281* (2013.01); *G09G 2310/0291* (2013.01); *G09G 2310/08* (2013.01); *H01L 27/3276* (2013.01)

(58) Field of Classification Search
CPC ... G09G 2300/0426; G09G 2300/0439; G09G 2300/0408; H01L 27/3276
See application file for complete search history.

(56) References Cited

U.S. PATENT DOCUMENTS

| 2015/0129853 | A1 | 5/2015 | Shin et al. |
| 2016/0071614 | A1 | 3/2016 | Lee |
| 2016/0307488 | A1 | 10/2016 | Kim et al. |
| 2017/0047030 | A1 | 2/2017 | Kim et al. |
| 2017/0154579 | A1 | 6/2017 | Choi et al. |
| 2017/0255074 | A1 | 9/2017 | Nishiyama et al. |

FOREIGN PATENT DOCUMENTS

| EP | 3193325 A1 | 7/2017 |
| JP | 2014-056238 A | 3/2014 |
| JP | 2017037298 A | 2/2017 |
| KR | 10-2015-0015638 A | 2/2015 |
| KR | 10-2015-0015639 A | 2/2015 |
| WO | 2014/069529 A1 | 5/2014 |
| WO | 2016/080542 A1 | 5/2016 |
| WO | 2017-120401 A | 7/2017 |

OTHER PUBLICATIONS

Partial European Search Report dated Jan. 7, 2019 issued in the corresponding European Patent Application No. 18181141.5, pp. 1-14.
Office Action issued by the Japanese Patent Office in the corresponding Japanese patent application No. 2018-132457, dated Aug. 27, 2019.

* cited by examiner

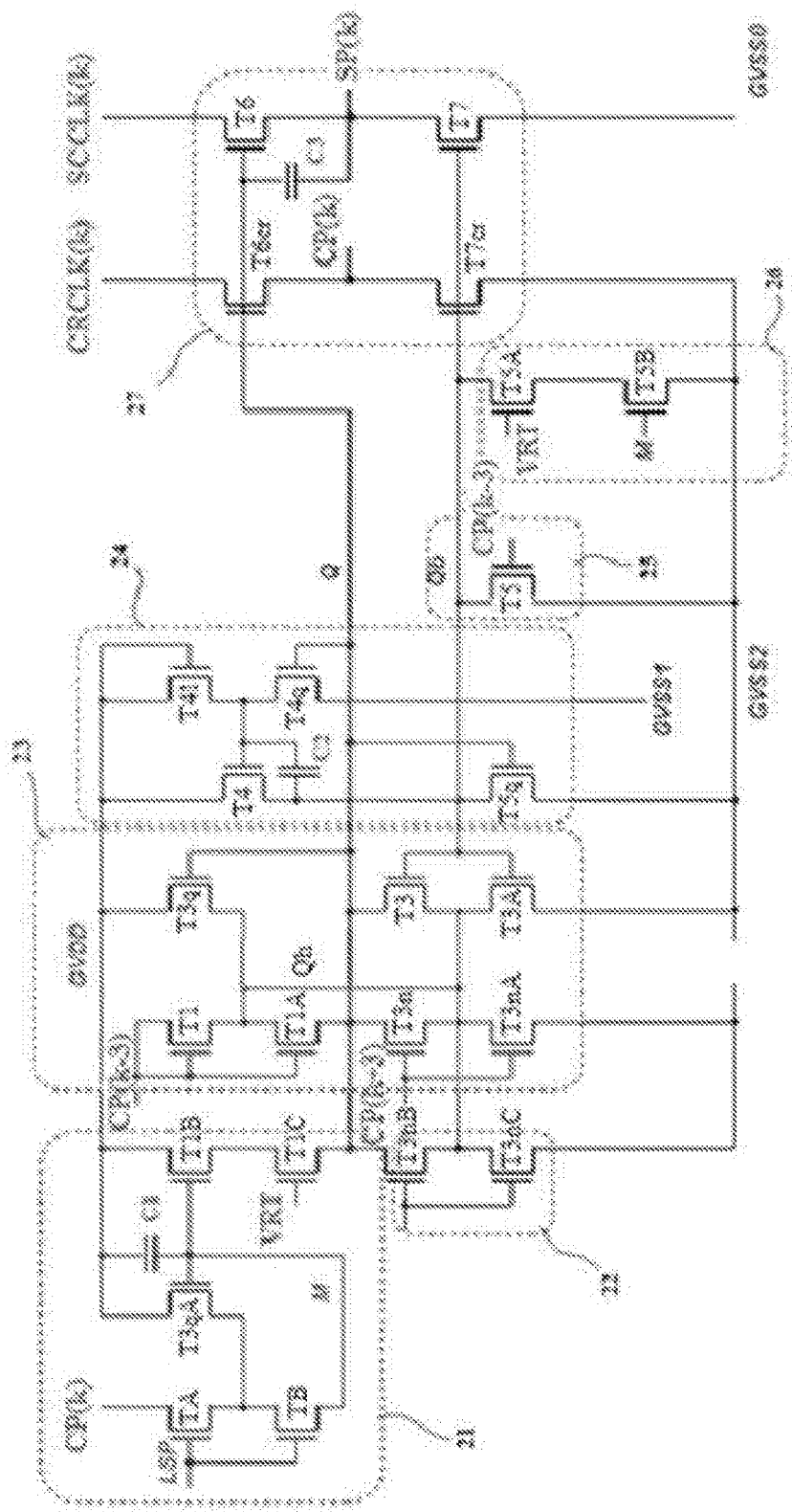
Replacement Sheet
FIG. 6

OLED DISPLAY PANEL AND OLED DISPLAY DEVICE

This application claims the benefit of Korean Patent Application No. 10-2017-0140208, filed on Oct. 26, 2017, which is hereby incorporated by reference in its entirety as if fully set forth herein.

BACKGROUND

Field of the Disclosure

The present disclosure relates to an OLED display panel and an OLED display device having driving signal application lines for driving a GIP driving circuit in an OLED display panel in which stages of the GIP driving circuit are arranged in a pixel array.

Description of the Background

With the development of information society and various portable electronic devices such as mobile communication terminals and notebook computers, demand for flat panel display devices applicable to the electronic devices has increased.

A liquid crystal display (LCD) and an organic light-emitting diode (OLED) display device using an OLED are used as such flat panel display devices.

Such a flat panel display device is composed of a display panel including a plurality of gate lines and a plurality of data lines in order to display images, and a driving circuit for driving the display panel.

Among the aforementioned display devices, a display panel of the LCD includes a thin film transistor array substrate having a thin film transistor array formed on a glass substrate, a color filter array substrate having a color filter array formed on a glass substrate, and a liquid crystal layer interposed between the thin film transistor array substrate and the color filter array substrate.

The thin film transistor array substrate includes a plurality of gate lines GL extended in a first direction and a plurality of data lines DL extended in a second direction perpendicular to the first direction, and a sub-pixel region (pixel: P) is defined by each gate line and each data line. Also, a thin film transistor and a pixel electrode are formed in the sub-pixel region P.

The display panel of the LCD displays an image by applying a voltage to electric field generation electrodes (a pixel electrode and a common electrode) to generate an electric field in the liquid crystal layer and adjusting the arrangement state of liquid crystal molecules of the liquid crystal layer through the electric field to control the polarization of incident light.

In addition, among the aforementioned display devices, a display panel of the OLED display device includes sub-pixels defined at the intersection of a plurality of gate lines and a plurality of data lines, and each sub-pixel includes an OLED composed of an anode, a cathode and an organic emission layer interposed between the anode and the cathode, and a pixel circuit for independently driving the OLED.

The pixel circuit can be configured in various manners and includes at least one switching TFT, a capacitor and a driving TFT.

The at least one switching TFT charges a data voltage in the capacitor in response to a scan pulse. The driving TFT controls the quantity of current supplied to the OLED in response to the data voltage charged in the capacitor to adjust the quantity of emitted light of the OLED.

Such a display panel for display devices is defined by an active area (AA) through which an image is displayed to a user and a non-active area (NA) that is a peripheral area of the active area AA.

In addition, the driving circuit for driving the display panel includes a gate driving circuit for sequentially supplying gate pulses (or scan pulses) to the plurality of gate lines, a data driving circuit for supplying a data voltage to the plurality of data lines, and a timing controller for supplying image data and various control signals to the gate driving circuit and the data driving circuit.

Although the gate driving circuit may be composed of at least one gate drive IC, the gate driving circuit may be simultaneously formed on the non-active area of the display panel in a process of forming the plurality of signal lines (gate lines and data lines) and sub-pixels of the display panel.

That is, a Gate-In-Panel (GIP) method of integrating the gate driving circuit into the display panel is applied.

The aforementioned gate driving circuit includes a larger number of stages than the number of gate lines in order to sequentially supply scan pulses to the gate lines. Each stage is composed of an oxide semiconductor TFT in order to improve driving characteristics.

That is, the gate driving circuit includes a plurality of cascaded stages. In addition, each stage includes an output unit which is connected to each gate line. Each stage receives a clock signal, a gate start signal, a gate high voltage and a gate low voltage from the timing controller, and generates a carry pulse and a scan pulse.

FIG. 1 is a block diagram showing driving circuits of the conventional OLED display device and a relationship between driving circuits.

Referring to FIG. 1, an OLED display device 100 includes an OLED display panel PNL and driving circuits for applying input image data to a pixel array 110 of the OLED display panel PNL.

The OLED display panel PNL includes a plurality of gate lines 149 and a plurality of data lines 139 arranged in an intersecting manner, and the pixel array 110 in which sub-pixels defined by the plurality of gate lines 149 and the plurality of data lines 139 are arranged in a matrix form.

Each sub-pixel includes an OLED composed of an anode, a cathode and an organic emission layer interposed between the anode and the cathode, and a pixel circuit for independently driving the OLED.

The pixel circuit may be configured in various manners and includes at least one switching TFT, a capacitor and a driving TFT.

The driving circuits for driving the OLED display panel PNL include a data driving circuit 130 which is formed in a non-active area and supplies a data voltage to the plurality of data lines 139, a GIP driving circuit 140 which is formed in the non-active area and sequentially supplies a gate (scan) signal synchronized with the data voltage to the plurality of gate lines 149, and a timing controller (TCON) 120.

The timing controller 120 is disposed on a printed circuit board (PCB), aligns input image data received from an external host system and supplies the aligned input image data to the data driving circuit 130. In addition, the timing controller 120 receives timing signals, such as a vertical synchronization signal, a horizontal synchronization signal, a data enable signal and a dot clock signal, synchronized with the input image, from the external host system and generates control signals (a data driver control signal DDC and a gate driver control signal GDC) for controlling operation timing of the data driving circuit 130 and the GIP driving circuit 140.

The data driving circuit 130 receives the input image data and the data driver control signal DDC from the timing controller 120 and converts the input image data into a gamma compensated voltage to generate a data voltage and outputs the data voltage to the plurality of data lines 139.

The data driving circuit 130 includes a plurality of source drive integrated circuits (ICs), each of which is configured in the form of a chip on film (COF) and each of which is connected between a pad part of the printed circuit board on which the timing controller 120 is mounted and a pad part of the display panel PNL.

The GIP driving circuit 140 may be disposed at one edge or both edges of the display panel PNL depending on driving method. The gate driving circuit 140 shown in FIG. 1 is an interlaced GIP driving circuit and includes a first GIP driving circuit 140L disposed on the left side of the display panel PNL and a second GIP driving circuit 140R disposed on the right side of the display panel PNL.

The first GIP driving circuit 140L and the second GIP driving circuit 140R may be simultaneously formed on the substrate of the display panel PNL. That is, the first GIP driving circuit 140L and the second GIP driving circuit 140 in the gate driving circuit may be simultaneously formed in bezel areas arranged at both sides of the display panel PNL.

The GIP driving circuit 140 sequentially supplies a gate (scan) signal to the gate lines 149 according to the control signal GDC transmitted from the timing controller 120.

Here, the GIP driving circuit 140 may directly receive a clock signal, a gate start signal, a gate high voltage and a gate low voltage from the timing controller 120 through the COF of the data driving circuit 130.

That is, a signal line (line-on-glass (LOG)) is formed in the non-active area of the display panel PNL, and signals such as the clock signal, the gate start signal, the gate high voltage and the gate low voltage are supplied from the timing controller 120 to the GIP driving circuit 140 through the signal line LOG.

FIG. 2 is a plan view schematically showing part of the active area and the non-active area of the conventional OLED display panel and FIG. 3 is a block diagram schematically showing the conventional OLED display device.

The display panel PNL is divided into the active area AA including a plurality of pixels P and the non-active area NA formed surrounding the active area AA.

The non-active area NA includes a pad part PAD, a data link part D_Link, a gate link part G_Link, a connection line CL and the GIP driving circuit 140.

The pad part PAD includes a gate pad part G_Pad for supplying various control signals VSS, VDD, CLK, VST and RESET to the GIP driving circuit 140 and a data pad part D_Pad for supplying a data voltage to each data line 139.

A COF (Chip On Film) on which source drive ICs are mounted is connected to the gate pad part G_Pad and the data pad part D_Pad.

The data link part D_Link extends between the data lines 139 arranged in the active area AA and the data pad part D_Pad to electrically connect the data lines 139 to the data pad part D_Pad, and the gate link part G_Link is used to supply external signals for driving the GIP driving circuit 140 and is extended between the GIP driving circuit 140 and the gate pad part G_Pad to electrically connect the GIP driving circuit 140 to the gate pad part G_Pad. Accordingly, a gate start signal VST, a plurality of clock signals CLK1, CLK2, CLK3 and CLK4, a reset signal RESET and a plurality of voltages VSS, VDD and VDD1 transmitted from the timing controller 120 are forwarded to the GIP driving circuit 140 through the gate link part G_Link.

The GIP driving circuit 140 is formed in the non-active area NA through a process of forming thin film transistors constituting the pixels P.

The GIP driving circuit 140 generates a gate (scan) signal and sequentially provides the gate (scan) signal to the gate lines 149 arranged in the active area AA. To this end, the GIP driving circuit 140 includes a plurality of stages ST respectively connected to the gate lines 149.

Each stage ST is enabled by the gate start signal VST or a carry signal supplied from the previous stage and is disabled by a carry signal output from the next stage to output one of the plurality of clock signals CLK1, CLK2, CLK3 and CLK4 as a carry signal or a gate (scan) signal.

Furthermore, the data driving circuit 130 may include one or more source drive ICs S-IC, as shown in FIG. 3. The source drive IC S-IC converts digital video data of an input image into an analog gamma compensated voltage to generate a data voltage and outputs the data voltage to the data lines 139 under the control of the timing controller 120. The source drive IC S-IC is mounted on a flexible circuit board, for example, a chip on film (COF).

FIG. 4 illustrates a configuration of the COF shown in FIG. 3.

The COF is attached to the pad part PAD of the display panel PNL and a source PCB SPCB through an anisotropic conductive film (ACF). Input pins of the COF are electrically connected to output terminals (pad) of the source PCB SPCB. Output pins of the COF are electrically connected to the pad part PAD of the display panel PNL through an ACF.

As shown in FIG. 4, signal lines GIP for delivering the gate start signal VST, the plurality of clock signals CLK1, CLK2, CLK3 and CLK4, the reset signal RESET and the plurality of voltages VSS, VDD and VDD1 supplied from the timing controller 120 to the gate pad part G_Pad of the display panel PNL are formed at the left and right sides of the COF, and a constant voltage line EVDD for delivering a constant voltage EVDD supplied from the timing controller 120 to a constant voltage pad (not shown) of the pad part of the display panel is provided at the center of the COF.

In the aforementioned conventional display panel, however, it is difficult to design a narrow bezel of the display device because the gate driving circuit is integrated into the non-active area of the display panel.

SUMMARY

Accordingly, the present disclosure devised to solve the aforementioned problem is to provide an OLED display panel and an OLED display device in which a GIP driving circuit is arranged in an active area in order to minimize a bezel size and a GIP signal is applied to the GIP driving circuit arranged in the active area using a single-sided COF.

An OLED display panel according to the present disclosure to accomplish the object includes: an active area including data lines, scan lines intersecting the data lines, and sub-pixels arranged at each intersection; stages of a GIP driving circuit distributed and arranged in a plurality of unit pixel regions corresponding to the scan lines in the active area to supply scan pulses to the scan lines; and a non-active area including a pad part, a link part and a LOG part, wherein the pad part includes a gate pad part for supplying various control signals to the stages of the GIP driving circuit, and a data pad part for supplying a data voltage to each data line, and the non-active area includes a plurality of signal lines extended from the gate pad part via the link part to the LOG part in order to supply various control signals to the GIP parts is arranged.

In addition, an OLED display device according to the present disclosure to accomplish the object includes: a display panel including: an active area including data lines, scan lines intersecting the data lines, and sub-pixels arranged at each intersection; stages of a GIP driving circuit distributed and arranged in a plurality of unit pixel regions corresponding to the scan lines in the active area to supply scan pulses to the scan lines; a non-active area including a pad part, a link part and a LOG part; and a plurality of COFs having source drive ICs mounted thereon and connected to the pad part, wherein the pad part includes a gate pad part for supplying various control signals to the stages of the GIP driving circuit, and a data pad part for supplying a data voltage to each data line, and the non-active area includes a plurality of signal lines extended from the gate pad part via the link part to the LOG part in order to supply various control signals to the GIP parts is arranged.

Here, each of the unit pixel regions may include at least three sub-pixels, a GIP part in which an element constituting each stage of the GIP driving circuit is arranged, and a GIP internal interconnection line part in which connection lines for connecting elements of the stage are arranged.

Here, the active area may further include a reference voltage supply line for supplying a reference voltage to each sub-pixel, and first and second constant voltage supply lines for supplying first and second constant voltages to each sub-pixel, and the data pad part may include first pads connected to the reference voltage supply line and second pads connected to the first and second constant voltage supply lines.

The signal lines may extend from the gate pad part via the link part to the LOG part, and the signal lines detour outside the pad part.

The link part may include a link line penetrating the pad part to connect one of the signal lines to the GIP parts.

Output pins of the COFs corresponding to the link line may be floated.

The OLED display panel and the OLED display device having the aforementioned characteristics according to the present disclosure have the following advantages.

First, since the GIP driving circuit is distributed and arranged in the active area, left and right bezels of the display panel can be minimized compared to the conventional display panel in which the GIP driving circuit is arranged in the non-active areas positioned at the left and right of the active area.

Second, the GIP driving circuit is arranged in the active area and signal lines are formed in an LOG part outside the PAD part to supply a GIP signal to GIP parts of the GIP driving circuit distributed and arranged in the active area, and thus the GIP signal can be provided using a single-sided COF.

BRIEF DESCRIPTION OF THE DRAWINGS

FIG. 6 is a circuit diagram of a k-th stage of a GIP driving circuit according to the present disclosure.

DETAILED DESCRIPTION

The applicant applied the technology of distributing and arranging GIP driving circuits in an active area of a display panel in order to minimize the size of a bezel of the display panel (Korean Patent Application No. 10-2017-0125355 (Filing date: Oct. 27, 2017)).

The disclosure of Korean Patent Application (10-2017-0125355) will be briefly described as follows.

Figure 5:
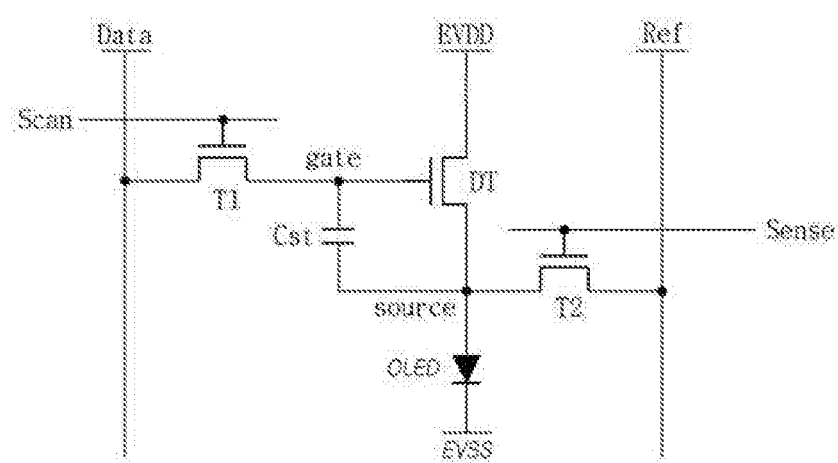
FIG. 5 is a circuit diagram of a sub-pixel in an OLED display panel of the present disclosure.

FIG. 5 is a circuit diagram of a sub-pixel in an OLED display panel of the present disclosure and FIG. 6 is a circuit diagram of a k-th stage of a GIP driving circuit according to the present disclosure.

Figure 4:
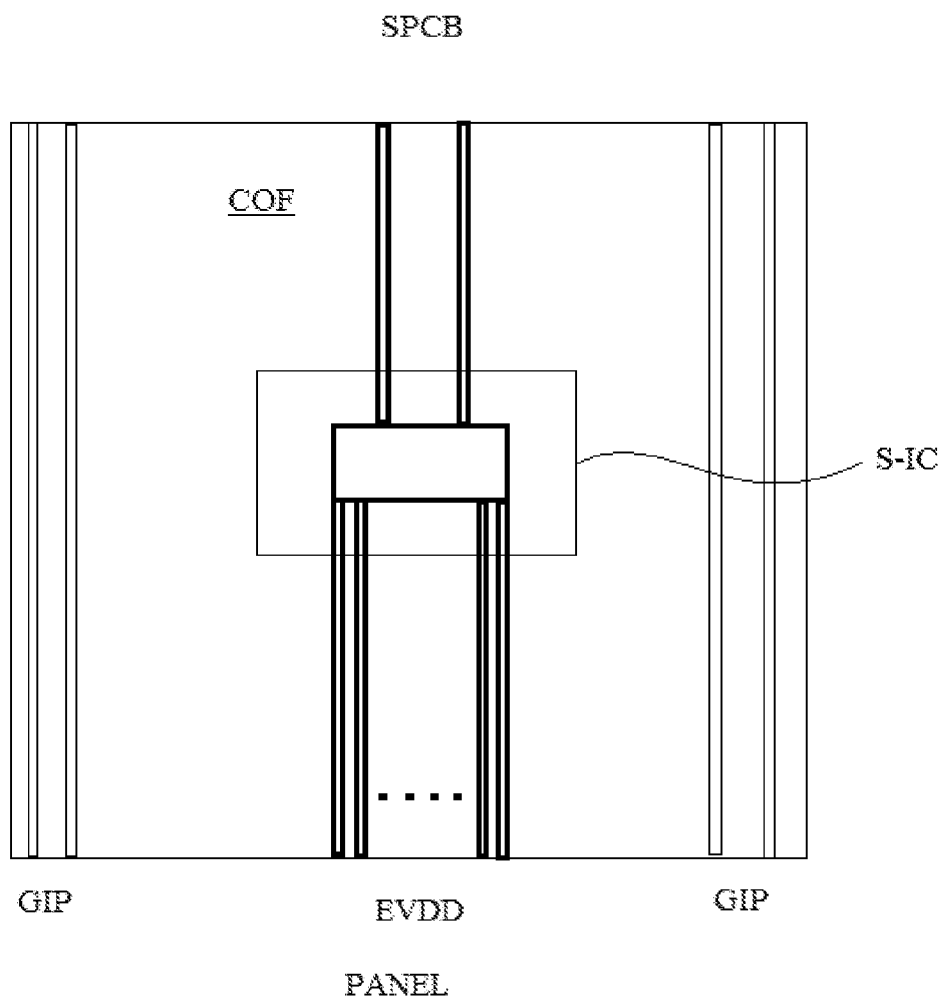
FIG. 4 is a diagram showing a specific configuration of a COF shown in FIG. 3.

That is, FIG. 5 corresponds to FIG. 4 of the Korean Patent Application (10-2017-0125355) and FIG. 6 corresponds to FIG. 5 of the Korean Patent Application (10-2017-0125355).

As shown in FIG. 5, each sub-pixel of the OLED display panel according to the present disclosure includes an OLED and a pixel circuit for driving the OLED.

The pixel circuit includes first and second switching TFTs T1 and T2, a storage capacitor Cst and a driving TFT DT.

The first switching TFT T1 charges a data voltage DATA in the storage capacitor Cst in response to a scan pulse signal. The driving TFT DT controls the quantity of current supplied to the OLED according to the data voltage charged in the storage capacitor Cst to adjust the quantity of emitted light of the OLED. The second switching TFT T2 senses the threshold voltage and mobility of the driving TFT DT in response to a sense signal.

The OLED may be composed of a first electrode (e.g., anode or cathode), an organic emission layer and a second electrode (e.g., cathode or anode).

The storage capacitor Cst is electrically connected between the gate and the source of the driving TFT DT to maintain a data voltage corresponding to an image signal voltage or a voltage corresponding thereto for one frame period.

Although FIG. 5 shows a 3T1C sub-pixel configuration composed of three TFTs T1, T2 and DT and one storage capacitor Cst, the present disclosure is not limited thereto and each sub-pixel of the OLED display panel according to the present disclosure may have a 4T1C, 4T2C, 5T1C or 5T2C sub-pixel configuration.

Meanwhile, as shown in FIG. 6, the circuit of the k-th stage of the GIP driving circuit according to the present disclosure includes: blank time first and second node controllers 21 and 26, which include transistors TA, TB, T3qA, T1B, T1C, T5A and T5B and a capacitor C1, selectively store a set signal CP(k) according to a line select pulse (LSP), charge a first node Q of the corresponding stage with a first constant voltage GVDD and discharge a second node Qb to a second constant voltage GVSS2 according to a vertical real-time (VRT) signal in a blank time; driving time first to third node controllers 23 and 25, which include transistors T1, T1A, T3n, T3nA, T3q, T3, T3A and T5, charge the first node Q of the corresponding stage with the voltage of a carry pulse CP(k−3) of the third previous stage according to the carry pulse CP(k−3), discharge the first node Q and a third node Qh to a second constant voltage GVSS2 according to a carry pulse CP(k+3) of the third next stage, and charge the third node Qh with the first constant voltage GVDD according to the voltage of the first node in a driving time; an inverter 24, which includes transistors T4, T4l, T4q and T5q and a capacitor C2, inverts the voltage of the first node Q and applies the inverted voltage to the second node Qb; an output buffer 27, which includes pull-up transistors T6cr and T6, pull-down transistors T7cr and T7 and a bootstrapping capacitor C3, receives one clock signal CRCLK(k) among a plurality of clock signals for carry pulse output and one clock signal SCCLK(k) among a plurality of clock signals for scan pulse output, and outputs a carry pulse CP(k) and a scan pulse SP(k) according to the voltages of the first node Q and the second node Qb; and a reset unit 22 which includes transistors T3nB and T3nC and discharges the first node Q to the second constant voltage GVSS2 according to a reset signal RST output from the timing controller in the blank time.

The transistors TB, TA and T3q in the blank time first and second node controllers 21 and 26 are turned on to store the set signal CP(k) in the capacitor C1 when the LSP is at a high level.

In addition, the transistors T1C and T5B are turned on to charge the first node Q with the first constant voltage GVDD and to discharge the second node Qb to the second constant voltage GVSS2 when the VRT signal is at a high level in the blank time.

The transistors T1, T1A and T5 in the driving time first to third node controllers 23 and 25 are turned on to charge the first node Q with the carry pulse CP(k−3) of the third previous stage and to discharge the second node Qb to the second constant voltage GVSS2 when the carry pulse CP(k−3) of the third previous stage is at a high level in the driving time. When the first node Q is charged and the second node Qb is discharged in this manner, the transistor T3q is turned on to charge the third node Qh with the first constant voltage GVDD.

When the carry pulse CP(k+3) of the third next stage is at a high level, the transistors T3n and T3nA are turned on to discharge the first node Q and the third node Qh to the second constant voltage GVSS2.

The inverter 24 inverts the voltage of the first node Q and applies the inverted voltage to the second node Qb.

In the output buffer 27, the pull-up transistor T6cr is turned on and the pull-down transistor T7cr is turned off to output one clock signal CRCLK(k) among the plurality of clock signals for carry pulse output as a carry pulse CP(k) when the first node Q is at a high level and the second node Qb is at a low level. Further, the pull-up transistor T6 is turned on and the pull-down transistor T7 is turned off to output one clock signal SCCLK(k) among the plurality of clock signals for scan pulse output as a scan pulse SP(k) when the first node Q is at a high level and the second node Qb is at a low level.

Here, when the clock signal SCCLK(k) for scan pulse output is applied at a high level, the bootstrapping capacitor C3 of the output buffer 27 bootstraps (couples) the first node Q and thus the first node Q has a higher potential.

In this manner, the output buffer 27 outputs the clock signal CRCLK(k) for carry pulse output and the clock signal SCCLK(k) for scan pulse output, which are input thereto, as a carry pulse CL(k) and a scan pulse SP(k) in a state in which the first node Q is bootstrapped, and thus output loss can be prevented.

In the reset unit 22, the transistors T3nB and T3nC are turned on to discharge the first node Q to the second constant voltage GVSS2 when the reset signal RST output from the timing controller is at a high level in the blank time.

Although FIG. 6 shows a stage of the GIP driving circuit driven with 6 phases, the present disclosure is not limited thereto and stages of the GIP driving circuit can be configured in various manners.

As shown in FIG. 6, each stage of the GIP driving circuit includes 25 transistors and 3 capacitors.

Accordingly, when a single unit element (transistor or capacitor) constituting the stage of the GIP driving circuit is distributed and arranged in a single unit pixel region, the circuit of a single stage for driving a single gate line (scan line) can be arranged.

Figure 7:
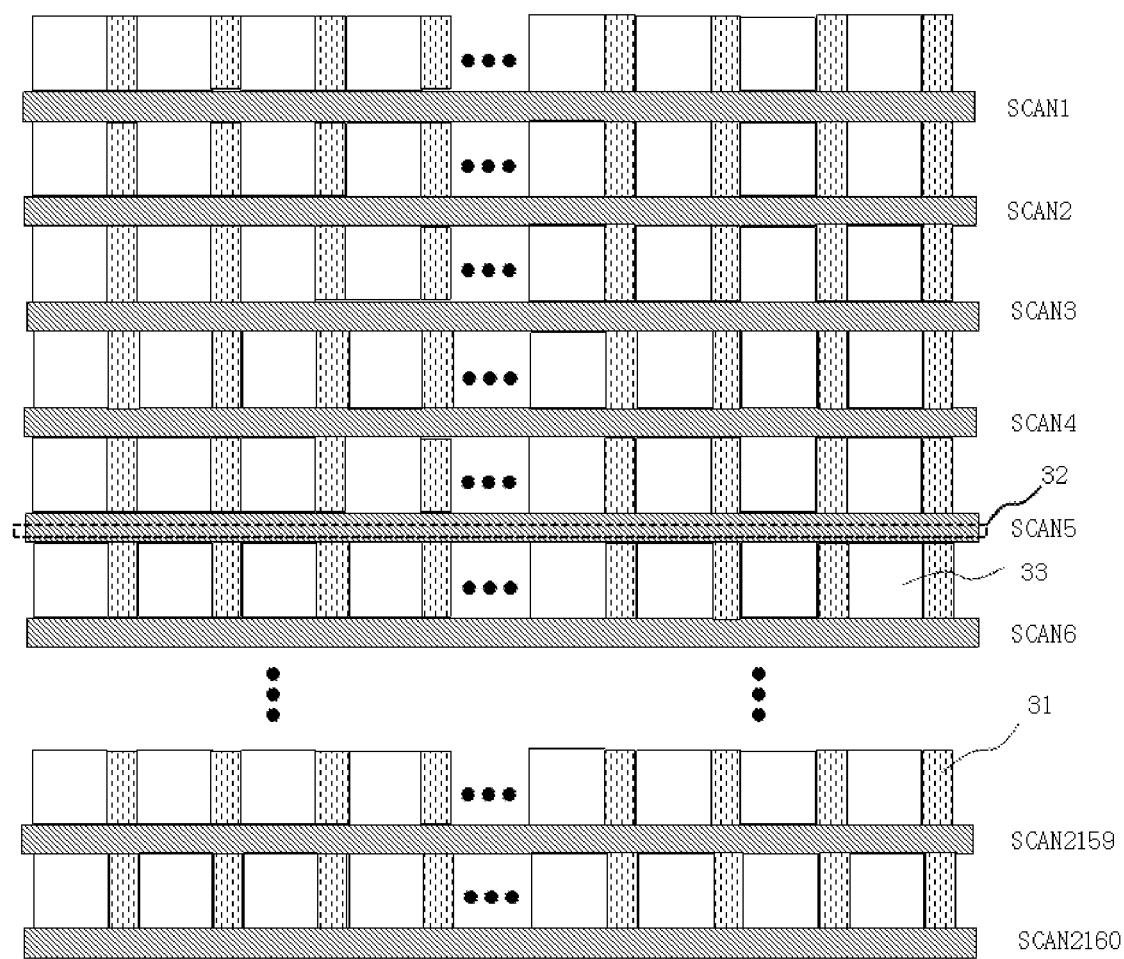
FIG. 7 is a diagram showing a configuration of an active area of the OLED display panel according to the present disclosure.
Figure 8:
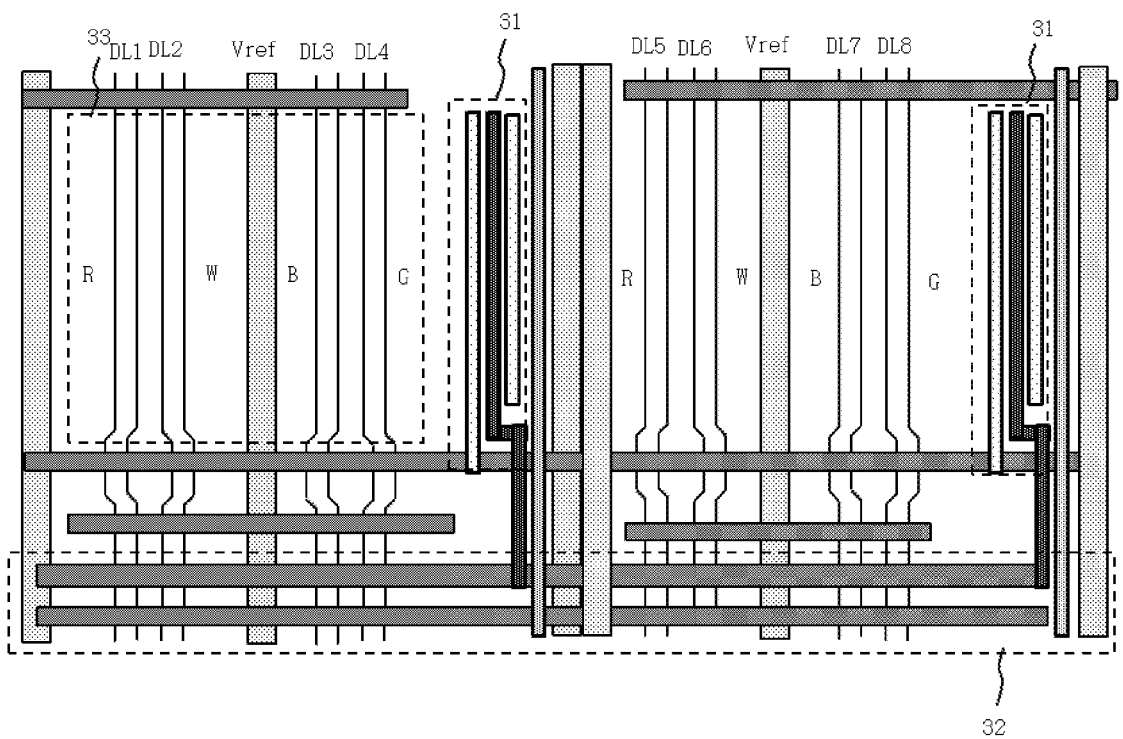
FIG. 8 is a diagram showing a detailed configuration of two neighboring unit pixels arranged in the active area of the OLED display panel of FIG. 7.

FIG. 7 is a diagram showing a configuration of the active area of the OLED display panel according to the present disclosure and FIG. 8 is a diagram showing a detailed configuration of two neighboring unit pixels arranged in the active area of the OLED display panel shown in FIG. 7.

That is, FIG. 7 corresponds to FIG. 6 of the Korean Patent Application (10-2017-0125355) and FIG. 8 corresponds to FIG. 7 of the Korean Patent Application (10-2017-0125355).

As shown in FIGS. 7 and 8, in arrangement of the GIP driving circuit in the active area of the OLED display panel, a unit pixel region of the active area is divided into at least three sub-pixels R, G, B and W, a GIP part 31 and a GIP internal interconnection line part 32.

The at least three sub-pixels R, G, B and W are configured in such a manner that a plurality of data lines DL1 to DL8, a plurality of reference voltage lines Vref and first and second constant voltage lines EVDD and EVSS are arranged in the vertical direction, and a plurality of gate lines (scan lines) SCAN are arranged in the horizontal direction.

The GIP part 31 corresponds to an element (transistor or capacitor) constituting a stage of the GIP driving circuit. That is, the element (transistor or capacitor) constituting the stage of the GIP driving circuit is distributed and arranged in a unit pixel region composed of red, green, blue and white sub-pixels R, G, B and W.

That is, at least one stage ST of the GIP driving circuit for driving a gate line (scan line) is distributed and arranged in a plurality of unit pixel regions driven by the gate line (scan line).

The GIP internal interconnection line part 32 is an area in which connection lines (a node Q, a node QB, etc.) for connecting elements in a stage of the GIP driving circuit are arranged.

As described above, as the GIP driving circuit is arranged in the active area, the plurality of data lines DL1 to DL8 and the reference voltage lines Vref for driving the sub-pixels R, G, B and W are arranged in the vertical direction, as shown in FIG. 8.

In addition, since the GIP part 31 corresponds to a unit element (transistor or capacitor) constituting a stage of the GIP driving circuit, one of the signals LSP, VRT, GVDD, GVSS0, GVSS1, GVSS2, VST, CRCLK and SCCLK shown in FIG. 6 is applied to the GIP part 31.

That is, the signal GVDD needs to be applied to the GIP part 31 if one of the transistors T3qA, T1B, T3q, T4 and T4l shown in FIG. 6 is disposed in the GIP part 31.

The signal GVSS2 needs to be applied to the GIP part 31 if one of the transistors T3nC, T3nA, T3A, T5q, T5, T5B and T7cr shown in FIG. 6 is disposed in the GIP part 31.

The signal CRCLK(k) needs to be applied to the GIP part 31 if the transistor T6cr shown in FIG. 6 is disposed in the GIP part 31.

The signal SCCLK(k) needs to be applied to the GIP part 31 if the transistor T6 shown in FIG. 6 is disposed in the GIP part 31.

The signal GVSS0 needs to be applied to the GIP part 31 if the transistor T7 shown in FIG. 6 is disposed in the GIP part 31.

The signal GVSS1 needs to be applied to the GIP part 31 if the transistor T4q shown in FIG. 6 is disposed in the GIP part 31.

The signal LSP needs to be applied to the GIP part 31 if one of the transistors TA and TB shown in FIG. 6 is disposed in the GIP part 31.

The signal VRT needs to be applied to the GIP part 31 if the transistor T5A shown in FIG. 6 is disposed in the GIP part 31.

Since the GIP driving circuit is arranged in the active area of the display panel as described above, the configuration of the conventional pad part has a problem in application of one of the signals LSP, VRT, GVDD, GVSS0, GVSS1, GVSS2, VST, CRCLK and SCCLK to the GIP part 31.

That is, when one of the signals LSP, VRT, GVDD, GVSS0, GVSS1, GVSS2, VST, CRCLK and SCCLK is applied to an element disposed in the GIP part 31 in the active area A/A using conventional GIP signal lines positioned at the left and right, there is a limitation in realization of a narrow bezel because the GIP signal lines are provided in the left and right non-active areas. Further, overlap with vertical lines (data lines, reference voltage supply lines, constant voltage lines, etc.) in the active area A/A increases.

Accordingly, the present disclosure modifies the configurations of the pad part and the link part such that one of the signals LSP, VRT, GVDD, GVSS0, GVSS1, GVSS2, VST, CRCLK and SCCLK can be applied to each GIP part 31 using a conventional single-sided COF.

Figure 9:
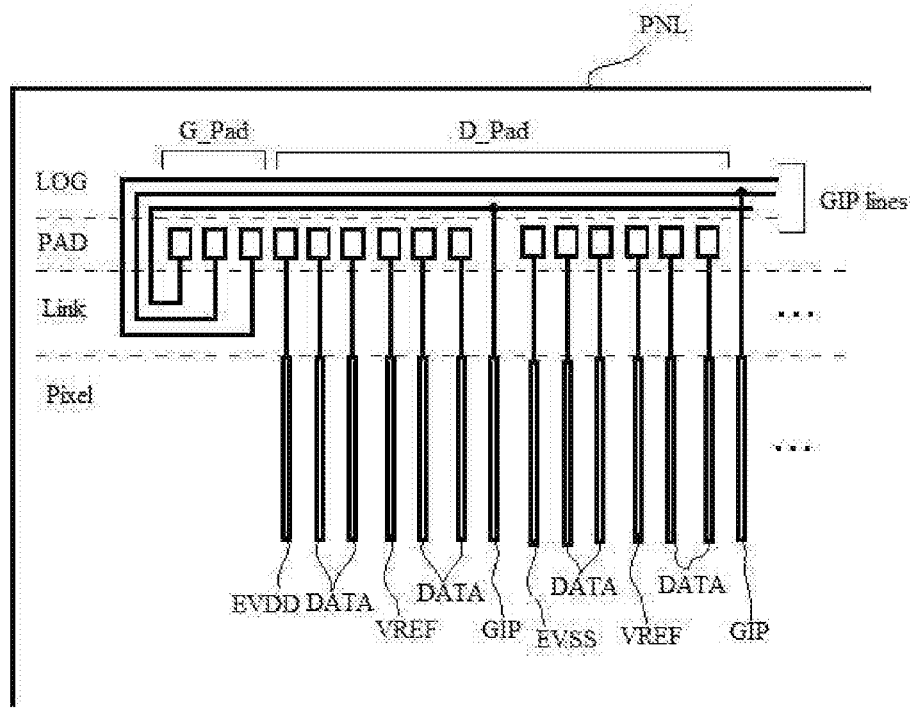
FIG. 9 is a plan view schematically showing part of the active area and the non-active area of the OLED display panel according to the present disclosure.

FIG. 9 is a plan view schematically showing part of an active area and a non-active area of a display panel according to the present disclosure.

The display panel PNL is divided into an active area (Pixel) AA including a plurality of pixels (not shown in FIG. 9, refer to pixels R, W, B and G in FIGS. 7 and 8), a plurality of data lines DATA for driving the pixels, a reference voltage supply line VREF, and power lines EVDD and EVSS for driving the pixels and gate (scan) lines (not shown in FIG. 9, refer to "SCAN" in FIGS. 7 and 8), and a non-active area NA formed surrounding the active area AA.

The non-active area NA includes a pad part PAD, a link part Link and a LOG part LOG.

The pad part PAD includes a gate pad part G_Pad for supplying various control signals LSP, VRT, GVDD, GVSS0, GVSS1, GVSS2, VST, CRCLK and SCCLK to the GIP parts 31 of the GIP driving circuit 140 which are distributed and arranged in the active area AA, and a data pad part D_Pad for supplying a data voltage to each data line DATA, supplying a reference voltage to the reference voltage supply line VREF and supplying constant voltages EVDD and EVSS to constant voltage lines EVDD and EVSS.

A chip on film (COF) on which source drive ICs are mounted is connected to the gate pad part G_Pad and the data pad part D_Pad.

Further, the gate pad part G_Pad and the data pad part D_Pad are independently configured per COF. That is, when six COFs are attached, six gate pad parts G_Pad and six data pad parts D_Pad are configured.

The link part Link has link lines arranged therein and extended between the data lines DATA, the reference voltage supply line VREF and the constant voltage lines EVDD and EVSS arranged in the active area AA and the data pad part D_Pad to electrically connect the lines to the data pad part D_Pad.

In addition, signal lines (GIP lines) for supplying various control signals via the gate pad part G_Pad to the GIP parts GIP (refer to 31 of FIG. 8) distributed and arranged in the active area are arranged in the link part Link and the LOG part LOG.

The signal lines (GIP lines) arranged in the LOG part are not extended to the end of the display panel and are configured per COF.

That is, the signal lines detour around the gate pad part G_Pad corresponding to each COF and extend to part of the active area driven by the corresponding COF and arranged in the LOG part LOG outside the pad part PAD. Accordingly, six signal lines (GIP lines) are arranged when six COFs are attached.

The signal lines (GIP lines) are extended to the LOG part LOG from the gate pad part G_Pad via the link part Link. The signal lines (GIP lines) detour around the pad part PAD and extend to the LOG part LOG outside the pad part PAD. In addition, when an element formed in the GIP part (GIP, 31) requires one of the various control signals LSP, VRT, GVDD, GVSS0, GVSS1, GVSS2, VST, CRCLK and SCCLK, as described above, a link line for connecting one of the signal lines (GIP lines) to the GIP part (GIP, 31) is formed in the link part Link via the pad part PAD.

Although FIG. 9 shows three pads and three signal lines (GIP lines) in the gate pad part G_Pad, the present disclosure is not limited thereto and a number of gate pad parts G_Pad and signal lines (GIP lines), which is equal to or greater than the number of various control signals LSP, VRT, GVDD, GVSS0, GVSS1, GVSS2, VST, CRCLK, are provided.

Figure 1:
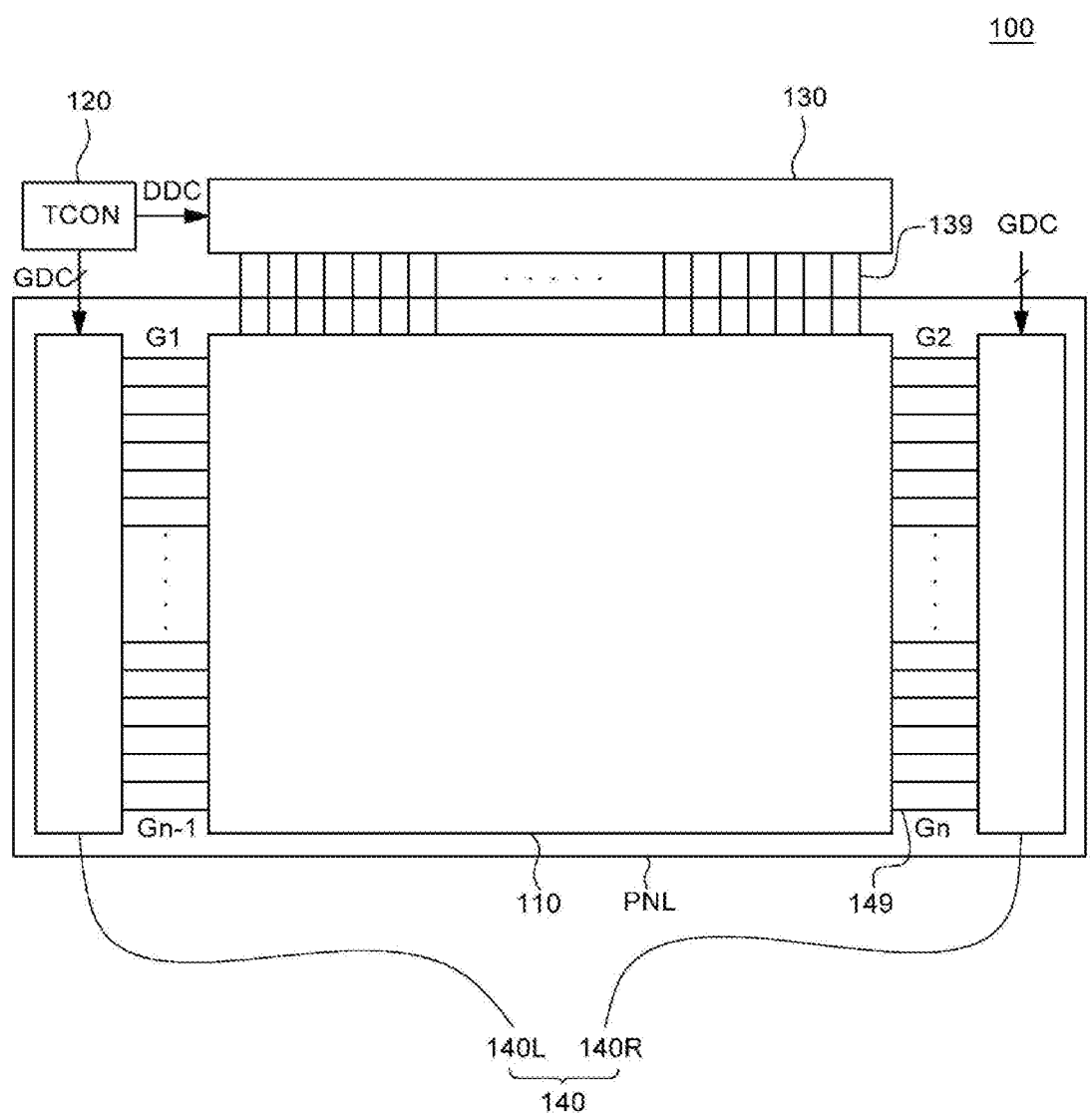
FIG. 1 is a block diagram showing driving circuits of the conventional OLED display device and a relationship between driving circuits.
Figure 2:
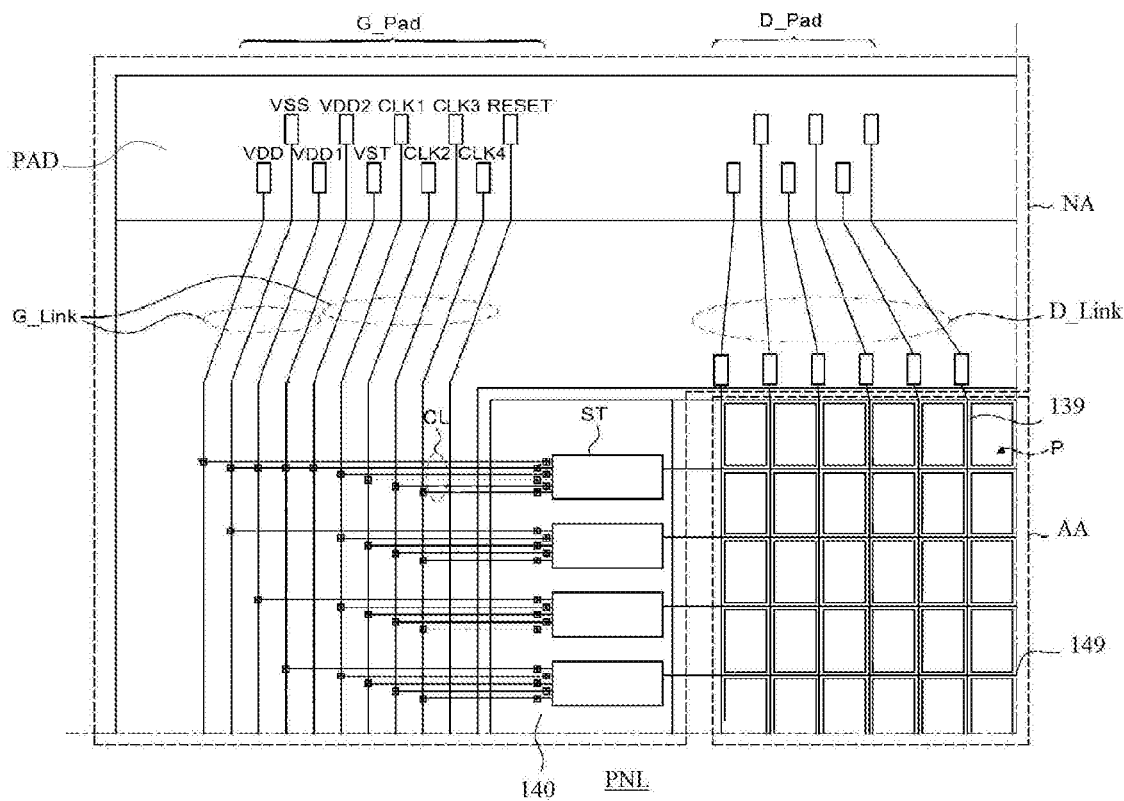
FIG. 2 is a plan view schematically showing part of an active area and a non-active area of the conventional OLED display panel.
Figure 3:
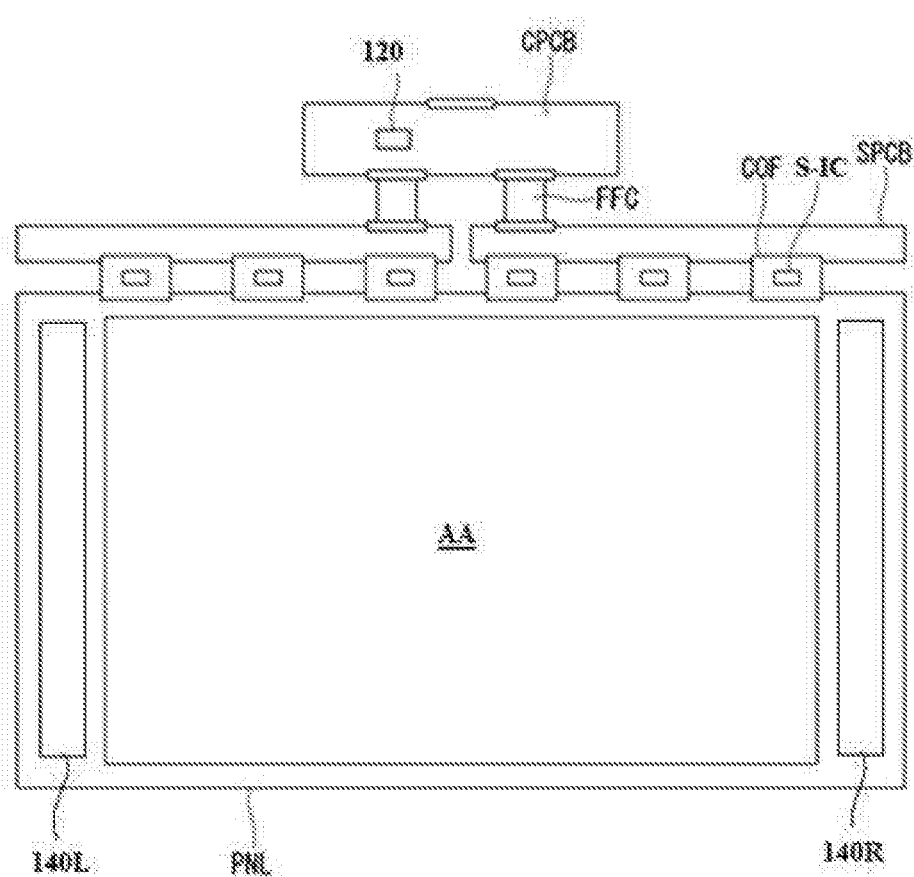
FIG. 3 is a block diagram schematically showing a configuration of the conventional OLED display device.

Further, the gate pad part G_Pad and the signal lines (GIP lines) are independently arranged per source drive IC (refer to COF and S-IC of FIG. 3).

On the other hand, the data driving circuit according to the present disclosure includes one or more source drive ICs S-IC, as shown in FIG. 3. The source drive IC S-IC converts digital video data of an input image into an analog gamma-compensated voltage to generate a data voltage and outputs the data voltage to the data lines 139 under the control of the timing controller 120. The source drive IC S-ID is mounted on a flexible circuit board, for example, a chip on film (COF).

COFs are attached to the pad part PAD and a source PCB SPCB of the display panel PNL through an anisotropic conductive film (ACF). Input pins of the COFs are electrically connected to output terminals (pads) of the source PCB SPCB. Output pins of the COFs are electrically connected to the pad part PAD of the display panel PNL through an ACF.

The COF according to the present disclosure is as described in FIG. 4. That is, signal lines GIP for delivering the various control signals LSP, VRT, GVDD, GVSS0, GVSS1, GVSS2, VST, CRCLK and SCCLK supplied from the timing controller 120 to the gate pad part G_Pad of the display panel PNL are formed at the left and right sides of the COF, and the constant voltage line EVDD for delivering the constant voltage EVDD supplied from the timing controller 120 to a constant voltage pad (not shown) of the pad part of the display panel is provided at the center of the COF.

Since the signal lines GIP are formed at the left and right sides of the COF and the constant voltage line EVDD is arranged at the center of the COF, as described above, the various control signals cannot be applied to the GIP parts 31 distributed and arranged in the display panel.

Accordingly, the arrangement of the signal lines (GIP lines) for supplying various control signals to the GIP parts GIP (refer to 31 of FIG. 8) in the display panel is modified, as shown in FIG. 9.

Although the arrangement of the signal lines (GIP lines) for supplying various control signals to the GIP parts GIP (refer to 31 of FIG. 8) in the display panel is not modified as shown in FIG. 9 and both-sided COFs may be used, signal lines GIP for delivering the various control signals LSP, VRT, GVDD, GVSS0, GVSS1, GVSS2, VST, CRCLK and SCCLK need to overlap with the constant voltage line EVDD for delivering the constant voltage EVDD in this case. Accordingly, interference may occur in the various control signals, causing an error, and COF cost increases.

Here, an output pin of the COF corresponding to the link line which penetrates the pad part PAD to connect one of the signal lines (GIP lines) to the GIP part (GIP, 31), described above with reference to FIG. 9, is floated.

As described above, the signal lines (GIP lines) for supplying various control signals to the gate pad part G_Pad and the GIP parts GIP (refer to 31 of FIG. 8) are arranged in the link part Link and the LOG part LOG, and the link line for connecting one of the signal lines (GIP lines) to the GIP parts (GIP, 31) is formed penetrating the pad part PAD, and thus the GIP driving circuit distributed and arranged in the active area can be driven using the conventional single-sided COF.

Those skilled in the art will appreciate that various modifications and variations can be made in the present disclosure without departing from the spirit or scope of the present disclosure through the above description. Accordingly, the scope of the disclosure should be determined by the appended claims and their legal equivalents, not by the above description.

What is claimed is:

1. An OLED display panel comprising:
   an active area where a plurality of data lines, a plurality of scan lines intersecting the plurality of data lines, and a plurality of sub-pixels are arranged at each intersection;
   a plurality of stages of a gate in panel (GIP) driving circuit distributed and arranged in a plurality of unit pixel regions corresponding to the plurality of scan lines in the active area to supply a plurality of scan pulses to the plurality of scan lines;
   a non-active area where a pad part including a gate pad part and a data pad part, a link part and a line on glass (LOG) part are arranged wherein the non-active area includes a plurality of signal lines extended from the gate pad part to the LOG part via the link part to supply a plurality of control signals to the plurality of stages, and
   a reference voltage supply line supplying a reference voltage to each sub-pixel, and a plurality of first and second constant voltage supply lines supplying first and second constant voltages to each sub-pixel,
   wherein the gate pad part supplies the plurality of control signals to the plurality of stages of the GIP driving circuit and the data pad part supplies a data voltage to each data line, and
   wherein the data pad part includes a plurality of pads connected to the reference voltage supply line and a plurality of pads connected to the plurality of first and second constant voltage supply lines.

2. The OLED display panel according to claim 1, wherein each of the plurality of unit pixel regions includes at least three sub-pixels, a GIP part in which an element constituting each stage of the GIP driving circuit is arranged, and a GIP internal interconnection line part in which connection lines for connecting elements of the stage are arranged.

3. The OLED display panel according to claim 1, wherein the plurality of signal lines is extended from the gate pad part and bypasses the pad part to extend to the LOG part via the link part.

4. The OLED display panel according to claim 1, wherein the link part includes a link line penetrating the pad part to connect one of the plurality of signal lines to the GIP parts.

5. The OLED display panel according to claim 1, wherein each stage of the GIP driving circuit comprises:
   an output buffer including a pull-up transistor, a pull-down transistor and a bootstrapping capacitor,
   wherein the bootstrapping capacitor bootstraps a first node of one of the stages of the GIP driving circuit such that the first node has a high potential when a clock signal for a scan pulse output is applied at a high level.

6. The OLED display panel according to claim 5, wherein the bootstrap capacitor is connected between a gate electrode and a source electrode of the pull-up transistor.

7. An OLED display device comprising:
   an active area where a plurality of data lines, a plurality of scan lines intersecting the plurality of data lines, and a plurality of sub-pixels are arranged at each intersection;
   a plurality of stages of a gate in panel (GIP) driving circuit distributed and arranged in a plurality of unit pixel regions corresponding to the plurality of scan lines in the active area to supply a plurality of scan pulses to the plurality of scan lines; and
   a non-active area where a pad part including a gate pad part and a data pad part, a link part and a line on glass (LOG) part are arranged wherein the non-active area includes a plurality of signal lines extended from the gate pad part to the LOG part via the link part to supply a plurality of control signals to the plurality of stages, wherein the gate pad part supplies the plurality of control signals to the plurality of stages of the GIP driving circuit and the data pad part supplies a data voltage to each data line; and
   a plurality of chip on films (COFs) having source drive ICs mounted thereon and connected to the pad part, wherein the plurality of signal lines in the non-active area is formed at left and right sides of the COFs, and a plurality of first and second constant voltage supply lines is arranged at a center of the COFs.

8. An OLED display panel comprising:
   a plurality of stages of a gate in panel (GIP) driving circuit arranged in a plurality of unit pixel regions corresponding to a plurality of scan lines in the active area and supplies a plurality of scan pulses to the plurality of scan lines;
   a plurality of data lines intersecting the plurality of scan lines, and a plurality of sub-pixels are arranged at each intersection in an active area; and
   a pad part disposed at a non-active area and including a gate pad part supplying the plurality of control signals to the plurality of stages of the GIP driving circuit and a data pad part supplying a data voltage to each data line;

a link part disposed at the non-active area and extended between a plurality of data lines in the active area;

a line on glass (LOG) part disposed at the non-active area and transmitting a clock signal, a gate start signal, a gate high voltage and a gate low voltage supplied from a timing controller to the GIP driving circuit; and a plurality of signal lines arranged at the non-active area and extended from the gate pad part to the LOG part through the link part and supplies a plurality of control signals to the plurality of stages.

9. The OLED display panel according to claim 8, further comprising a plurality of unit pixel regions each including at least three sub-pixels, a GIP part in which an element constituting each stage of the GIP driving circuit is arranged, and a GIP internal interconnection line part in which connection lines for connecting elements of the stage are arranged.

10. The OLED display panel according to claim 8, further comprising a reference voltage supply line supplying a reference voltage to each sub-pixel, and a plurality of first and second constant voltage supply lines supplying first and second constant voltages to each sub-pixel at the active area.

11. The OLED display panel according to claim 10, wherein the data pad part includes a plurality of pads connected to the reference voltage supply line and a plurality of pads connected to the plurality of first and second constant voltage supply lines.

12. The OLED display panel according to claim 8, wherein the plurality of signal lines is extended from the gate pad part and bypasses the pad part to extend to the LOG part via the link part.

13. The OLED display panel according to claim 8, wherein the link part includes a link line penetrating the pad part to connect one of the plurality of signal lines to the GIP parts.

14. The OLED display panel according to claim 8, wherein each stage of the GIP driving circuit comprises:

an output buffer including a pull-up transistor, a pull-down transistor and a bootstrapping capacitor, wherein the bootstrapping capacitor bootstraps a first node of one of the stages of the GIP driving circuit such that the first node has a high potential when a clock signal for a scan pulse output is applied at a high level.

15. The OLED display panel according to claim 14, wherein the bootstrap capacitor is connected between a gate electrode and a source electrode of the pull-up transistor.

* * * * *